United States Patent [19]
Freilich et al.

[11] 4,142,241
[45] Feb. 27, 1979

[54] HARMONIC INSENSITIVE PHASE SENSITIVE DEMODULATOR

[75] Inventors: Arthur Freilich, Plainview; Avraham Kalron, Elmhurst, both of N.Y.

[73] Assignee: North Atlantic Industries, Inc., Hauppauge, N.Y.

[21] Appl. No.: 843,690

[22] Filed: Oct. 19, 1977

[51] Int. Cl.² .................... H03D 3/06; G06F 15/34
[52] U.S. Cl. ................................. 364/724; 328/134; 363/39; 363/44
[58] Field of Search .............. 364/724; 307/232; 328/133, 134, 166; 329/2, 50, 124; 340/347 SY; 363/39, 44, 45

[56] References Cited

U.S. PATENT DOCUMENTS

| 3,517,298 | 6/1970 | Richman ................................ 363/44 |
| 3,699,461 | 10/1972 | Huntsinger ........................... 328/134 |
| 3,723,890 | 3/1973 | Hutsinger ......................... 328/134 X |
| 3,793,592 | 2/1974 | Matonak et al. ................. 328/134 X |
| 3,839,716 | 10/1974 | Reichnebacher et al. .... 340/347 SY |
| 3,940,693 | 2/1976 | Brown ............................. 328/134 X |

*Primary Examiner*—Jerry Smith
*Attorney, Agent, or Firm*—Morgan, Finnegan, Pine, Foley & Lee

[57] ABSTRACT

A harmonic insensitive phase sensitive demodulator which converts complex AC waveforms to a DC voltage proportional to the fundamental component at an arbitrary phase with respect to a reference voltage and eliminates, to any desired degree, the effects of harmonics of the reference frequency present in the complex AC waveforms.

14 Claims, 4 Drawing Figures

HARMONIC INSENSITIVE PHASE SENSITIVE DEMODULATOR

BACKGROUND AND BRIEF DESCRIPTION OF THE INVENTION

The present invention relates to phase sensitive demodulators and, more particularly, to a harmonic insensitive phase sensitive demodulator. To put the present invention into perspective, it is useful to consider the operation and limitations of conventional full-wave phase sensitive demodulators and analog multipliers.

A conventional full-wave phase sensitive demodulator employs a reference Er and a signal Es as inputs, and produces an output having an average value which is proportional to the cosine of the phase angle between the two inputs. The operation of the full-wave phase sensitive demodulator may be better understood by considering it to involve the multiplication of the signal Es by a square wave Er having an amplitude which is alternately $+1$ and $-1$. The square wave may be expanded in a Fourier series as:

$$Er = (4/\pi)(\sin wt + \tfrac{1}{3}\sin 3wt + 1/5 \sin 5 wt + \ldots) \quad (1)$$

By use of the following trigonometric identities:

$$\sin w_1 t \cdot \sin w_1 t = \sin^2 w_1 t = \tfrac{1}{2} - \tfrac{1}{2}\cos 2w_1 t \quad (2)$$

$$\sin w_1 t \cos w_2 t = \tfrac{1}{2}\sin(w_1+w_2)t + \tfrac{1}{2}\sin(w_1-w_2)t$$
$$\sin w_1 t \cos w_1 t = \tfrac{1}{2}\sin 2w_1 t \quad (3)$$

it is evident that a DC output will result only if the signal Es contains frequencies in the reference square wave which are not in quadrature phase with the reference frequency components.

All other frequencies and quadrature components of the reference frequencies will result in only AC components called ripple. In short, a full-wave phase sensitive demodulator will exhibit response to a fundamental and to odd order harmonics in inverse proportion to the harmonic order. This response to harmonics is generally undesirable and it is an object of this invention to produce a phase sensitive demodulator that will eliminate as many of the odd order responses as desired, while maintaining the switching nature of the demodulator.

It is evident that, in the description of the full-wave phase sensitive demodulator, if Er were a sinusoid of a given frequency, an output DC would result only if that frequency were present in the signal Es. This could be done by using a linear analog multiplier. This technique has the undesirable characteristic of producing a DC output proportional to both the signal and reference, requiring some means for accurately controlling the reference amplitude. Analog multipliers also have poor temperature stability and non-linearities.

The prior art has managed to render the outputs of phase sensitive demodulators, also known as phase sensitive detectors, insensitive to the presence of certain odd harmonics of the reference frequency which are present in the input signal.

Thus, in U.S. Pat. No. 3,839,716 there is taught the use of "$\pi/6$" chopping waveforms which do not contain the third, ninth, fifteenth, twenty-first, etc. odd harmonics. This results in a demodulator output which is not sensitive to the presence of those odd harmonics in the input signal. In U.S. Pat. No. 3,517,298 a technique is disclosed for eliminating certain pairs of odd harmonics, e.g., the 3rd and 5th; the 11th and 13th; the 19th and 21st; the 27th and 29th; etc. Thus, while the prior art teaches the elimination of certain odd harmonics, it does not teach that one may, to any desired degree, eliminate the effects of harmonic distortion. That is the subject of the instant invention.

As can be seen from the previous discussion, if the multiplying signal Er were perfectly sinusoidal, the resultant multiplication would yield a DC output proportional only to the component of the signal Es that is the same frequency as the reference [Equation (2)] and thus be independent of harmonics. Using digital techniques it is possible to synthesize a sinusoid of a purity limited only by the digital resolution. This can be done by considering the synthesized waveform as analogous to that of a sinusoid which has been passed through a sample and hold system. Sampled data theory indicates that the frequency content of this waveform is w, fs $\pm$ w, 2fs $\pm$ w, 3fs $\pm$ w, etc. Where the sampling frequency fs is equal to 16w, the synthesized waveform has the following Fourier series:

$$\sin wt + 1/15 \sin 15wt + 1/17 \sin 17wt + 1/31 \sin 31wt + 1/33 \sin 33wt +$$

As is apparent, the 3rd, 5th, 7th, 9th, 11th, and 13th harmonics have been eliminated, thereby eliminating any DC outputs due to their presence in the signal.

If one wished to eliminate the 15th and 17th harmonics as well one could synthesize a sinusoidal waveform having the following Fourier series by using a sampling frequency fs of 20w.

$$\sin wt + 1/19 \sin 19wt + 1/21 \sin 21wt + 1/39 \sin 39wt + 1/41 \sin 41wt + 1/59 \sin 59wt + 1/61 \sin 61wt +$$

In general, to render the demodulator output insensitive to the presence of the nth and lower odd harmonics of the reference frequency in the input signal one should synthesize a sinusoidal waveform having the following Fourier series by using a sampling frequency of $(n+3)w$ or a multiple thereof: $\sin wt + 1/n+2 \sin(n+2)wt + 1/n+4 \sin(n+4)wt + 1/2n+5 \sin(2n+5)wt + 1/2n+7 \sin(2n+7)wt + 1/3n+8 \sin(3n+8)wt + 1/3n+10 \sin(3n+10)wt +$ In practice, n should have a value of at least 7 and preferably as high as 13 or 29 for high levels of harmonic rejection. In practice, rejecting the 29th and lower harmonics has been found to be particularly efficacious.

As will be appreciated, because of limitations imposed by tolerances, digital resolution, etc. it is not practical to synthesize a function having exactly the above Fourier series. It is sufficient, however, if one synthesizes a function having substantially that Fourier series, which will ensure that the demodulator output is rendered substantially insensitive to the nth and lower odd harmonics of the reference frequency which are present in the input signal Es. Obviously, the more closely the Fourier series of the synthesized function approaches the ideal the more complete will be the harmonic rejection.

BRIEF DESCRIPTION OF THE DRAWINGS

Serving to illustrate exemplary embodiments of the invention are the drawings, of which.

DETAILED DESCRIPTION

Figure 1:
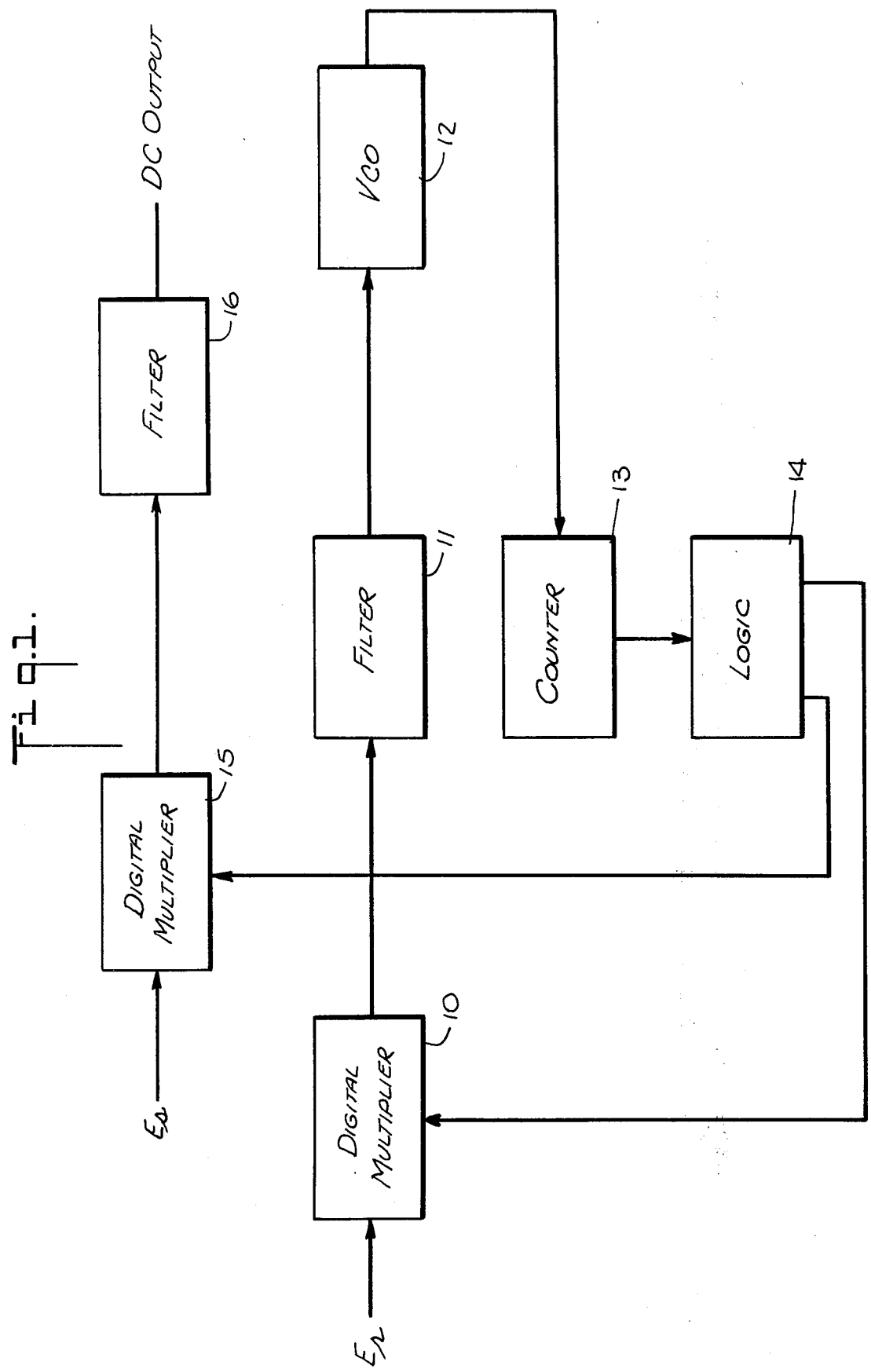
FIG. 1 is a schematic block diagram of one embodiment of the present invention.

FIG. 1 is a schematic block diagram of one embodiment of the present invention. It shows a phase locked loop comprising digital multiplier 10, filter 11, voltage controlled oscillator (VCO) 12, counter 13 and logic 14. A reference signal Er having a frequency w is fed to one input of a digital multiplier 10. The output of digital multiplier 10 is fed to the input of low pass filter 11, the output of which is connected to the input of voltage controlled oscillator (VCO) 12. VCO 12 oscillates at a frequency which is a multiple of the frequency w of the reference signal. In the particular example here being discussed, wherein the 13th and lower odd harmonics are eliminated, VCO 12 oscillates at a frequency of 16w. Thus, the spacing of each output pulse from VCO 12 is equivalent to $(360°/16) = 22.5°$. In general, to eliminate the nth and lower odd harmonics of the frequency w of the reference signal Er from the detector output, VCO 12 should oscillate at a frequency of $(n + 3)w$ or a multiple thereof.

The output of VCO 12 is fed to counter 12 which divides the frequency of the VCO ouput down to w. The outputs from counter 13 are fed to logic 14 which decodes the counter outputs and switches digital multipliers 10 and 15 in accordance therewith. In the present example, with VCO 12 oscillating at 16w and counter 13 dividing by 16, logic 14 switches every 22.5°.

As is clear from the foregoing description, digital multiplier 10 functions as a demodulator. Accordingly, a conventional full-wave phase sensitive demodulator or detector may be substituted for digital multiplier 10, but not for digital multiplier 15. The use of digital multiplier 10 in the phase locked loop has the advantage, however, of rendering the phase locked loop insensitive to nth order and lower odd harmonics of frequency w which may be present in the reference signal.

Figure 2:
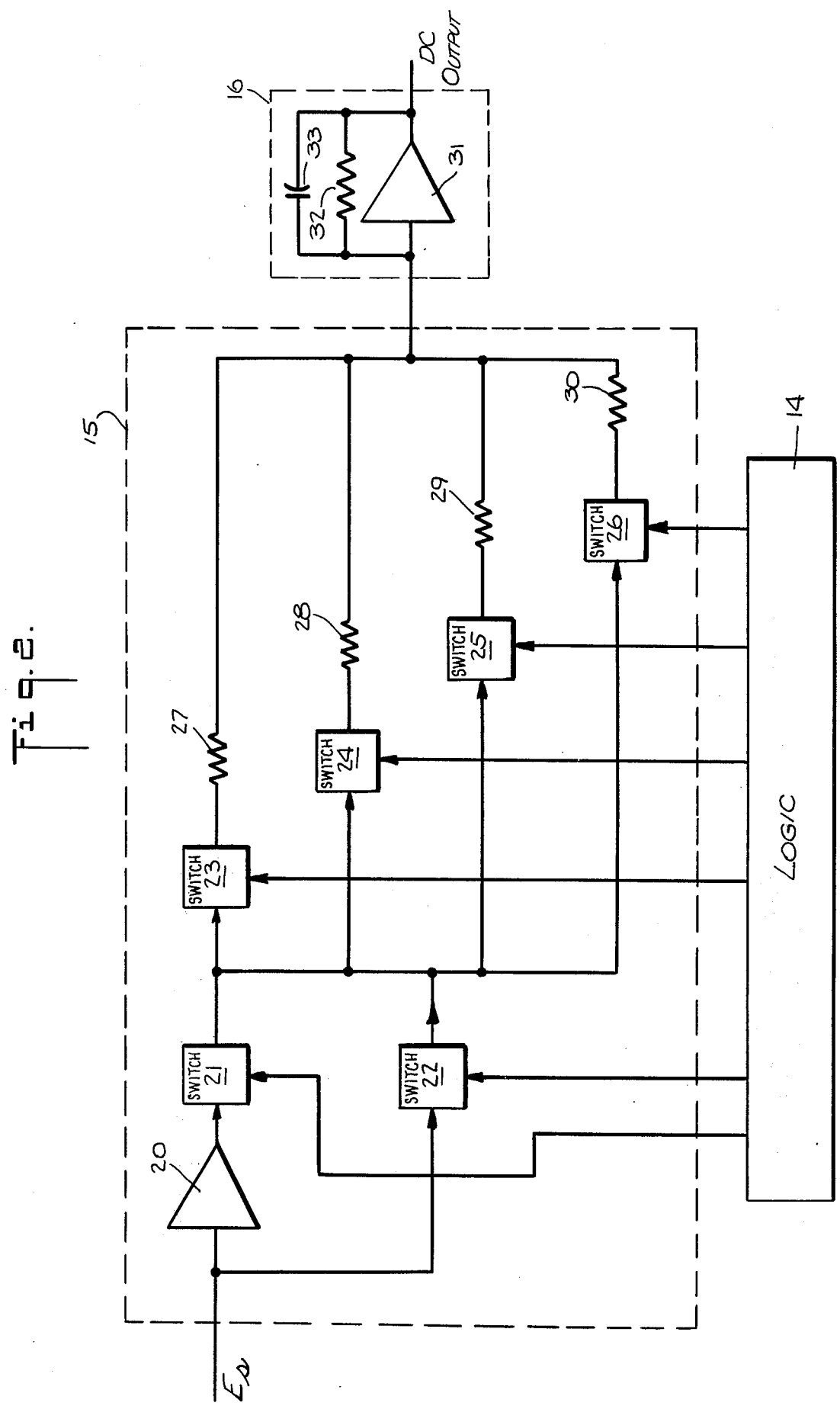
FIG. 2 is a schematic block diagram of one embodiment of the digital multiplier of FIG. 1.

Referring now to FIG. 2, there is illustrated one exemplary embodiment of digital multiplier 15. The circuit shown in FIG. 2 may be used in a system wherein it is desired to render the demodulator output insensitive to the 13th and lower odd harmonics of the reference frequency w which are present in the input signal Es.

The input signal Es is fed to the input of an inverting operational amplifier 20 which multiplies Es by $-1$. The output of amplifier 20, as well as the non-inverted signal, are fed to switches 21 and 22, respectively. Switches 21 and 22 are controlled by logic 14 which determines whether $+Es$ or $-Es$ appears at the common output of switches 21 and 22.

The common output of switches 21 and 22 is connected to an array of switches 23, 24, 25 and 26, the outputs of which are connected, respectively, to resistors 27, 28, 29 and 30. Switches 23-26 are also controlled by logic 14 and, together with resistors 27-30, form a resistive network. For the example here being discussed, resistors 27-30 are weighted, respectively, (1/sin 22.5°), (1/sin 45°), and (1/sin 67.5°), and (1/sin 90°).

To eliminate the effect of the nth and lower odd harmonics of the reference frequency present in the input signal additional switches 23-26 resistors 27-30 may be employed. In general, the weighting of resistors is proportional to $$\frac{1}{\sin\left(\frac{360}{n+3}\right)°}, \frac{1}{\sin\left(\frac{2\cdot 360}{n+3}\right)°}, \frac{1}{\sin\left(\frac{3\cdot 360}{n+3}\right)°},$$

$$\frac{1}{\sin\left(\frac{4\cdot 360}{n+3}\right)°}, \text{etc.}$$

The output from the resistive network is fed to a low pass filter 16 comprising operational amplifier 31, resistor 32 and capacitor 33. The output from filter 16 is the desired DC output signal.

Switch 22 is closed at the points of synthesis between 0° and 180°, where the sine is positive, while switch 21 is closed at the points of synthesis between 180° and 360° where the sine is negative. Switch 23 closes at 22.5°, 157.5°, 202.5° and 337.5°. Switch 24 closes at 45°, 135°, 225° and 315°. Switch 25 closes at 67.5°, 112.5°, 247.5° and 292.5°. Finally, switch 26 closes at 90° and 270°. Each of these switches will remain closed for a period of 22.5°.

Figure 4:
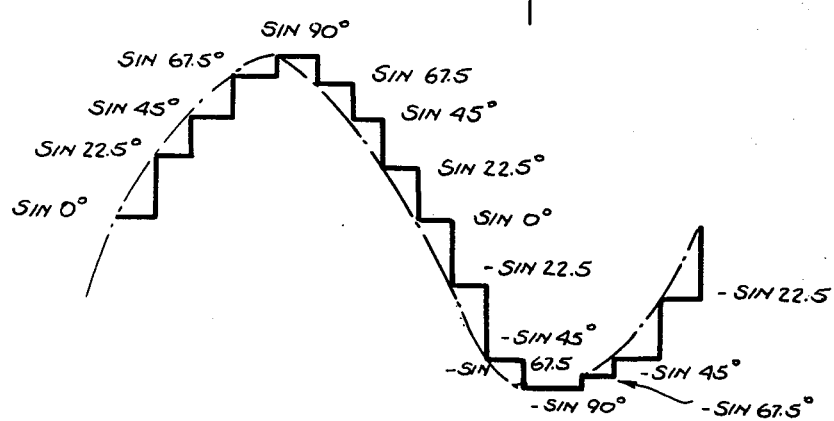
FIG. 4 is a pictorial representation of a synthesized waveform.

FIG. 4 illustrates pictorially the waveform resulting from such a synthesis.

Figure 3:
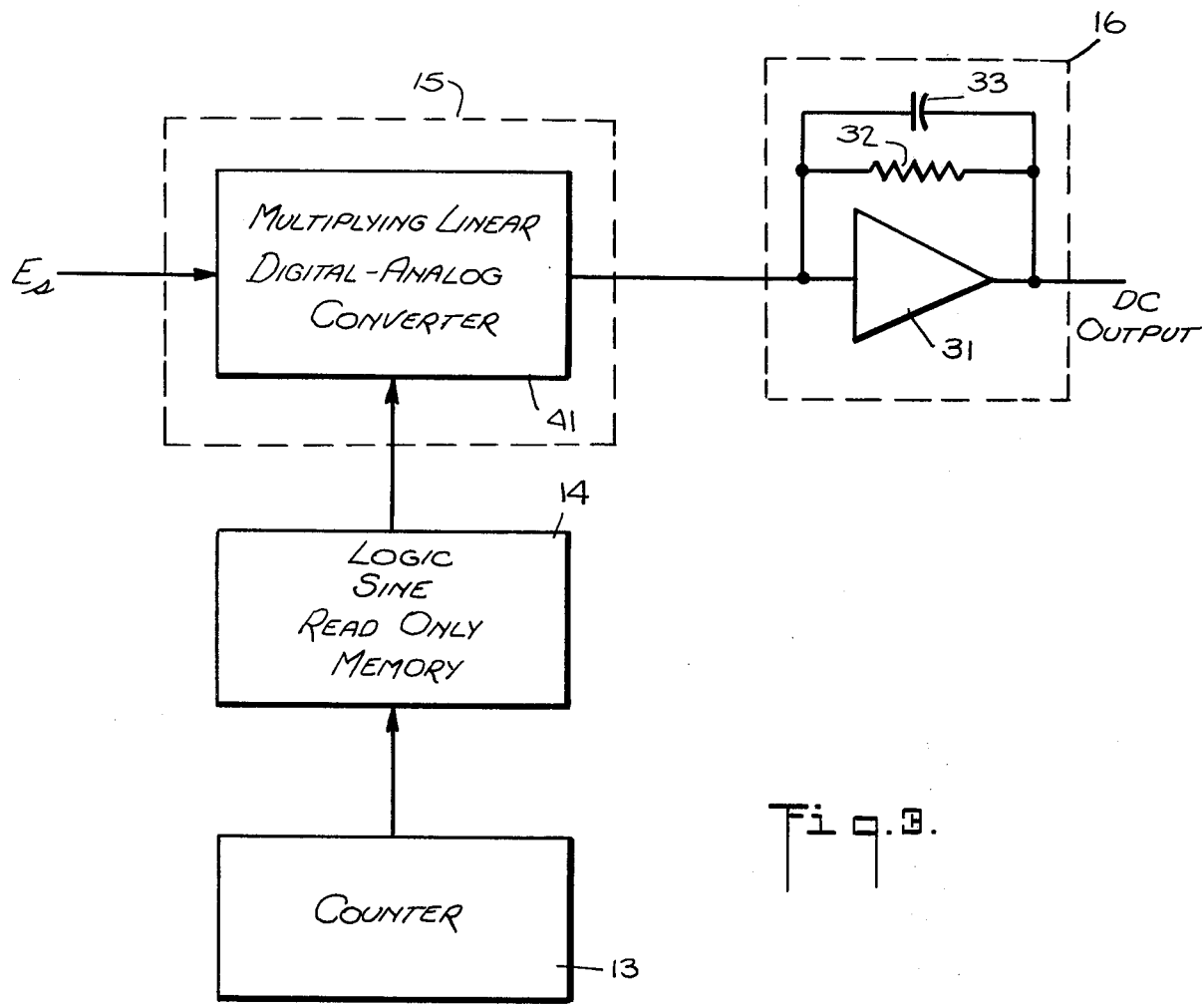
FIG. 3 is a schematic block diagram of another embodiment of the digital multiplier of FIG. 1.

Referring now to FIG. 3, there is illustrated another embodiment of digital multiplier 15. In the embodiment of FIG. 3 the outputs from counter 13 are fed to the logic 14, which in this case is a sine read only memory (ROM). Each count from counter 13 causes sine ROM 14 to produce a digital output proportional to the sine of the input corresponding to the point of synthesis. The output from sine ROM 14, which is a trigonometrically weighted digital number, is fed to the input of multiplying linear digital-analog converter 41 which multiplies Es by the appropriate sine value. The output of D/A converter 41 is fed to low pass filter 16, previously described. An example of the D/A converter 41 is Precision Monolithics part number DAC-08.

The invention disclosed and claimed herein is not limited to the specific mechanisms and techniques herein shown and described since modifications will undoubtedly occur to those skilled in the art. Hence, departures may be made from the form of the instant invention without departing from the principles thereof.

We claim:

1. A phase sensitive demodulator responsive to a reference signal having a frequency w and to an input signal comprising:

(a) means for synthesizing from said reference signal a sinusoidal function having a Fourier series substantially of the form sin $$(wt + \theta) + \frac{1}{n+2}\sin(n+2)(wt+\theta) + \frac{1}{n+4}\sin(n+4)$$

$$(wt + \theta) + \frac{1}{2n+5}\sin(2n+5)(wt+\theta) +$$

$$\frac{1}{2n+7}\sin(2n+7)(wt+\theta) + \frac{1}{3n+8}\sin(3n+8)$$

$$(wt + \theta) + \frac{1}{3n+10}\sin(3n+10)(wt+\theta) + \ldots, n$$

being an odd number and at least 7; and (b) means for digitally multiplying said function and said input signal so as to render the demodulator output substantially insensitive to the nth and lower odd harmonics of w present in the input signal.

2. The phase sensitive demodulator of claim 1 wherein n is an odd number and at least 13.

3. The phase sensitive demodulator of claim 1 wherein n is an odd number and at least 29.

4. The phase sensitive demodulator of claim 1 wherein said synthesizing means comprises a phase locked loop.

5. The phase sensitive demodulator of claim 4 wherein said phase locked loop comprises:
   (a) a demodulator having as one input said reference signal;
   (b) a voltage controlled oscillator connected to the output of said deomodulator, said oscillator oscillating at a frequency of at least $(n+3)w$; and
   (c) counter means connected to the output of said voltage controlled oscillator and to said demodulator for dividing the output frequency of said oscillator down to the frequency $w$ and providing switching signals for said demodulator.

6. A phase sensitive demodulator sensitive to a reference signal having a frequency $w$ and to an input signal comprising:
   (a) phase locked loop means for synthesizing from said reference a sinusoidal function having a Fourier series substantially of the form sin $$(wt + \theta) + \frac{1}{n+2} \sin(n+2)(wt + \theta) + \frac{1}{n+4} \sin(n+4)$$

$$(wt + \theta) + \frac{1}{2n+5} \sin(2n+5)(wt + \theta) +$$

$$\frac{1}{2n+7} \sin(2n+7)(wt + \theta) + \frac{1}{3n+8} \sin(3n+8)$$

$$(wt + \theta) + \frac{1}{3n+10} \sin(3n+10)(wt + \theta) + ...,$$

n being an odd number and at least 7; and
   (b) means for digitally multiplying said function and said input signal so as to render the demodulator output substantially insensitive to the nth and lower odd harmonics of w present in the input signal, said digital multiplying means comprising a switched resistive network, said resistive network being weighted trigonometrically.

7. The phase sensitive demodulator of claim 6 wherein said phase locked loop comprises:
   (a) a demodulator having as one input said reference signal;
   (b) a voltage controlled oscillator connected to the output of said demodulator, said oscillator oscillating at a frequency of at least $(n+3)w$;
   (c) counter means connected to the output of said voltage controlled oscillator and to said demodulator for dividing the output frequency of said oscillator down to the frequency $w$ and providing switching signals for said demodulator.

8. The phase sensitive demodulator of claim 6 wherein said phase locked loop comprises:
   (a) a digital multiplier having as one input said reference signal;
   (b) a voltage controlled oscillator connected to the output of said digital multiplier, said oscillator oscillating at a frequency of at least $(n+3)w$;
   (c) counter means connected to the output of said voltage controlled oscillator for dividing the output frequency of said oscillator down to the frequency $w$;
   (d) logic means connected to the outputs of said counter means and to the other input of said digital multiplier to switch said multiplier every $360/n+3$ degrees so as to render the phase locked loop substantially insensitive to the nth and lower odd harmonics present in the reference signal.

9. A phase sensitive demodulator responsive to a reference signal having a frequency $w$ and to an input signal comprising:
   (a) phase locked loop means for synthesizing from said reference a sinusoidal function having a Fourier series substantially of the form sin $$wt + \frac{1}{n+2} \sin(n+2)(wt + \theta) + \frac{1}{n+4}$$

$$\sin(n+4)(wt + \theta) + \frac{1}{2n+5} \sin(2n+5)(wt + \theta) +$$

$$\frac{1}{2n+7} \sin(2n+7)(wt + \theta) + \frac{1}{3n+8} \sin(3n+8)(wt + \theta) +$$

$$\frac{1}{3n+10} \sin(3n+10)(wt + \theta) + ...,$$

n being an odd number and at least 7;
   (b) means for digitally multiplying said reference signal and said sinusoidal function so as to render the demodulator output subtantially insensitive to the nth and lower odd harmonics of w present in the input signal, said digital multiplying means comprising a sine read only memory and a multiplying linear digital-analog converter connected thereto.

10. The phase sensitive demodulator of claim 9 wherein said phase locked loop comprises:
    (a) a demodulator having as one input said reference signal;
    (b) a voltage controlled oscillator connected to the output of said demodulator, said oscillator oscillating at a frequency of at least $(n+3)w$; and
    (c) counter means connected to the output of said voltage controlled oscillator and to said demodulator for dividing the output frequency of said oscillator down to w and providing switching signals for said demodulator.

11. The phase sensitive demodulator of claim 9 wherein said phase locked loop comprises:
    (a) a digital multiplier having as one input said reference signal;
    (b) a voltage controlled oscillator connected to the output of said digital multiplier, said oscillator oscillating at a frequency of at least $(n+3)w$;
    (c) counter means connected to the output of said voltage controlled oscillator for dividing the output frequency of said oscillator down to the frequency $w$;
    (d) logic means connected to the outputs of said counter means and to the other input of said digital multiplier to switch said multiplier every $360/n+3$ degrees so as to render the phase locked loop substantially insensitive to the nth and lower odd harmonics present in the reference signal.

12. The phase sensitive demodulator of claim 11 wherein n is an odd number and at least 29.

13. A method for the phase sensitive demodulation of an input signal with a reference signal having a frequency w comprising the steps of:

(a) synthesizing from said reference a sinusoidal function having a Fourier series substantially of the form $$\sin(wt + \theta) + \frac{1}{n+2}\sin(n+2)(wt + \theta) + \frac{1}{n+4}\sin(n+4)(wt + \theta) + \frac{1}{2n+5}\sin(2n+5)(wt + \theta) + \frac{1}{2n+7}\sin(2n+7)(wt + \theta) + \frac{1}{3n+8}\sin(3n+8)(wt + \theta) + \frac{1}{3n+10}\sin(3n+10)(wt + \theta) + \ldots,$$

n being an odd number and at least 7; and (b) digitally multiplying said function and said input signal so as to produce an output signal substantially insensitive to the nth and lower odd harmonics of w present in the input signal.

14. The method of claim 13 wherein the synthesizing step comprises the steps of:
(a) generating an intermediate signal having a frequency of at least (n+3)w;
(b) dividing the frequency of said intermediate signal down to w; and
(c) demodulating the reference signal.

* * * * *

UNITED STATES PATENT AND TRADEMARK OFFICE
CERTIFICATE OF CORRECTION

PATENT NO. : 4,142,241
DATED : February 27, 1979
INVENTOR(S) : Arthur Freilich and Avraham Kalron It is certified that error appears in the above-identified patent and that said Letters Patent are hereby corrected as shown below:

Column 2, lines 43-46 should be written as follows:

$$--\sin wt + [1/(n+2)] [\sin (n+2)wt] + [1/(n+4)] [\sin (n+4)wt] + [1/(2n+5)] [\sin (2n+5)wt] + [1/(2n+7)] [\sin (2n+7)wt] + [1/(3n+8)] [\sin (3n+8)wt] + [1/(3n+10)] [\sin (3n+10)wt] + \ldots .--$$

In Claim 1, element (a), the first term of the Fourier series is "$\sin (wt+\theta)$".

In Claim 6, element (a), the first term of the Fourier series is "$\sin (wt+\theta)$".

In Claim 9, element (a), the first term of the Fourier series is "$\sin (wt+\theta)$".

UNITED STATES PATENT AND TRADEMARK OFFICE
CERTIFICATE OF CORRECTION

PATENT NO. : 4,142,241
DATED : February 27, 1979
INVENTOR(S) : Arthur Freilich and Avraham Kalron It is certified that error appears in the above–identified patent and that said Letters Patent are hereby corrected as shown below:

In Claim 13, element (a), the first term of the Fourier series is "sin (wt+θ)".

Signed and Sealed this

Twenty-fourth Day of July 1979

[SEAL]

*Attest:*

*Attesting Officer*

LUTRELLE F. PARKER
*Acting Commissioner of Patents and Trademarks*